United States Patent [19]

Rosswurm

[11] Patent Number: 4,556,842
[45] Date of Patent: Dec. 3, 1985

[54] TRACKING FILTER FOR SENSING DC CONTENT IN AN AC WAVEFORM

[75] Inventor: Mark A. Rosswurm, Ada, Ohio

[73] Assignee: Westinghouse Electric Corp., Pittsburgh, Pa.

[21] Appl. No.: 517,497

[22] Filed: Jul. 26, 1983

[51] Int. Cl.⁴ .................. G01R 19/00; H04B 15/00; H02P 13/20
[52] U.S. Cl. .................................. 324/102; 307/520; 324/103 P; 324/107; 328/165; 363/96; 363/97
[58] Field of Search .............. 324/111, 102, 103, 107; 364/483, 757, 575; 328/165; 363/96, 97

[56] References Cited

U.S. PATENT DOCUMENTS

| 4,305,132 | 12/1981 | Tsuboshima et al. | 455/63 |
| 4,318,617 | 3/1982 | Orseu | 364/571 |
| 4,370,702 | 1/1983 | Shuey et al. | 363/42 |
| 4,500,837 | 2/1985 | Shuey et al. | 324/102 |

OTHER PUBLICATIONS

Parasuramau, B., "Hardware Multiplication Techniques for Microprocessor Systems", *Computer Design*, Apr. 1977, pp. 75–82.

*Primary Examiner*—Stewart J. Levy
*Assistant Examiner*—Stephen M. Baker
*Attorney, Agent, or Firm*—R. P. Lenart

[57] ABSTRACT

The DC content of an AC waveform is detected by a digital filter which partially filters each phase of the waveform and applies the filtered waveforms sequentially through a multiplexer to a sample and hold circuit which measures the instantaneous value of each phase at two points which are spaced an exact odd number of half cycles apart. The time interval between the measurement points is adjusted according to variations in the AC waveform frequency to maintain required spacing. The measured instantaneous values are fed by an analog to digital converter and to a microprocessor system which averages the two readings to generate a signal corresponding to the DC content for each phase.

16 Claims, 5 Drawing Figures

TRACKING FILTER FOR SENSING DC CONTENT IN AN AC WAVEFORM

BACKGROUND OF THE INVENTION

This invention relates to methods and apparatus for determining the DC content of an AC waveform and has particular application to determining the DC content in an AC waveform generated by single or multiphase inverters which may be subject to changes in output frequency.

Electronic power generation systems are capable of generating a DC component in an AC output. Such a DC component is often generated in inverters where there are differences in the characteristics of the paired electronic switches generating the AC waveform. This DC component, if excessive, can cause extremely high DC circulating currents in AC loads such as motors and transformers. As a result, the output DC content must be sensed by a system protection circuit to shut down the generating system if internal DC content controls fail.

A commonly assigned application entitled "Detection Of DC Content In An AC Waveform", Ser. No. 225,226, filed Jan 15, 1981 by Shuey et al., now U.S. Pat. No. 4,500,837, discloses methods and apparatus for determining the DC content in an AC waveform and is hereby incorporated by reference. That application discloses a method and apparatus which determines the DC content in an AC waveform by initially measuring and storing the instantaneous value of the AC waveform at a first point in a cycle. A second measurement of the instantaneous value of the waveform is then made at a point spaced from the first point by a fixed time interval which is substantially an exact odd number of waveform half cycles. By measuring the instantaneous value of the waveform at two instants which are separated by an odd number of waveform half cycles, the measured values will be an equal amount above and below the mid-value of the waveform. Averaging the two instantaneous values results in the average value of the waveform and hence the DC content. The disclosed method for determining DC content is independent of the point in the waveform where the first measurement is made. However, the second measurement is always made at a fixed time interval corresponding to an exact odd number of waveform half cycles of the AC waveform at a nominal frequency, following the first point of measurement. If variations in the output frequency of the AC waveform occur, a substantial error can be introduced into the DC content measurement. It is an object of the present invention to provide methods and apparatus for DC content sensing in an AC waveform which may be subject to frequency variations

SUMMARY OF THE INVENTION

An apparatus for generating a signal representative of the DC content in an AC waveform, constructed in accordance with the present invention comprises: means for measuring the instantaneous value of the AC waveform; means for storing the measured instantaneous values; means for determining a time interval which is substantially equal to an exact odd number of half cycles of the AC waveform; and control means for operating the measuring and storing means to measure the instantaneous value of the AC waveform at a first point in time and to store the measured value, and for subsequently operating the measuring means to measure a second instantaneous value of the AC waveform at a second point in time spaced from the first point by the previously determined time interval, and for generating a DC content signal by averaging the first and second measured instantaneous values. By making instantaneous value measurements of the waveform at points which are spaced by substantially an exact odd number of waveform half cycles, the measured values will be equally displaced above and below the mid-value of the waveform. The average value of the two measured values is then equal to the DC content of the AC waveform. In the preferred embodiment, the time interval between measurements is determined by a programmable counter which is directed to begin counting at a predetermined initial count and to count down to a final count, which is proportional to the frequency of the AC waveform. The final count is then used by a digital processor to determine a sampling time interval which is substantially equal to an exact odd number of half cycles of the AC waveform at the frequency used to establish the final count.

The apparatus of this invention determines the DC content of an AC waveform in accordance with a method comprising the steps of: measuring the instantaneous value of the AC waveform at a first point in a cycle of the AC waveform; storing a signal representative of the first instantaneous value; measuring the frequency of the AC waveform; determining a time interval which is substantially equivalent to an exact odd number of half cycles of the AC waveform at the measured frequency; measuring the instantaneous value of the AC waveform at a second point in the waveform separated by the determined time interval from the first point; and generating a signal equal to the DC content of the AC waveform by averaging the first and second instantaneous values of the AC waveform. If desired, the DC content signal can be compared with a threshold signal to generate an output signal only when the DC content exceeds the threshold. Additionally, the amount by which the DC content exceeds the threshold can be integrated and the output signal generated only after the accumulated volt seconds exceeds a predetermined amount.

In applying the invention to the detection of DC content in a multiphase AC waveform, the instantaneous value of each phase is measured in sequence at a first point in a cycle and stored. A second measurement is then made at a second point in each phase which is separated by the previously determined time interval from the point at which the first measurement was made. The first and second values for each phase are then averaged sequentially. The DC content of the greatest magnitude can then be determined and used as described above to generate an output signal.

DESCRIPTION OF THE PREFERRED EMBODIMENT

Figure 1:
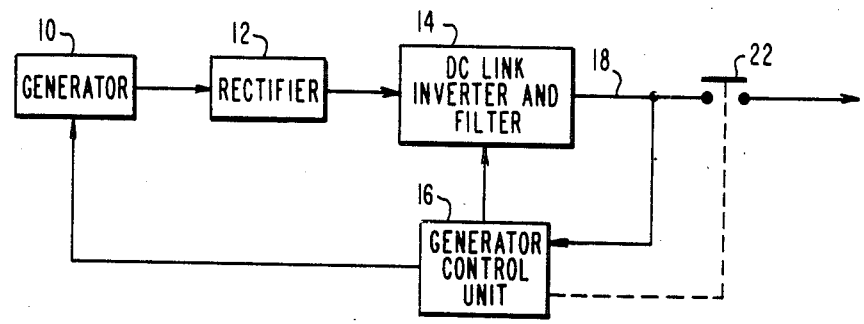
FIG. 1 is a schematic diagram in block diagram form of a DC link inverter system incorporating the present invention.

Although the present invention could be used in many applications where it is desired to determine the DC content of an AC waveform, it will be described as applied to the inverter power system illustrated in FIG. 1. In this system, a three phase AC voltage produced by generator 10 driven by a prime mover (not shown) is rectified by full wave rectifier 12 and applied to a DC link inverter and filter 14. The electronic switches of the inverter are controlled by an inverter control within generator control unit 16 to generate a three phase AC output voltage waveform on bus 18. Generator control unit 16 also monitors inverter operation, shuts down the generator 10, and disconnects the load from the inverter by opening the disconnect 22 if prescribed operating limitations are exceeded. If the AC waveform output frequency of the power system varies, for example if the electronic power system is paralleled with a hydro-mechanical power generation system, the DC content sensing apparatus must track the entire range of possible output frequencies to avoid sensing errors.

A system such as that shown in FIG. 1, is used for instance in an aircraft electric power generating system to generate a three phase AC voltage at a common nominal frequency of 400 hertz from an AC generator which is driven at varying rpm by the aircraft engine. A detailed description of a suitable DC link inverter and filter 14 and inverter control is set forth in U.S. Pat. No. 4,370,702, issued Jan. 25, 1983 to Shuey et al. and entitled "Microprocessor Control Of Inverter Power Transistors With DC Content Control" which is hereby incorporated by reference into this application for the purpose of disclosing a complete system. While the waveform generator of this reference system includes means for controlling the DC content in the inverter output, it is still desirable to provide separate DC content sensing in the generator control unit in the event that the waveform generator is not successful in maintaining the DC content within prescribed limits.

Figure 2:
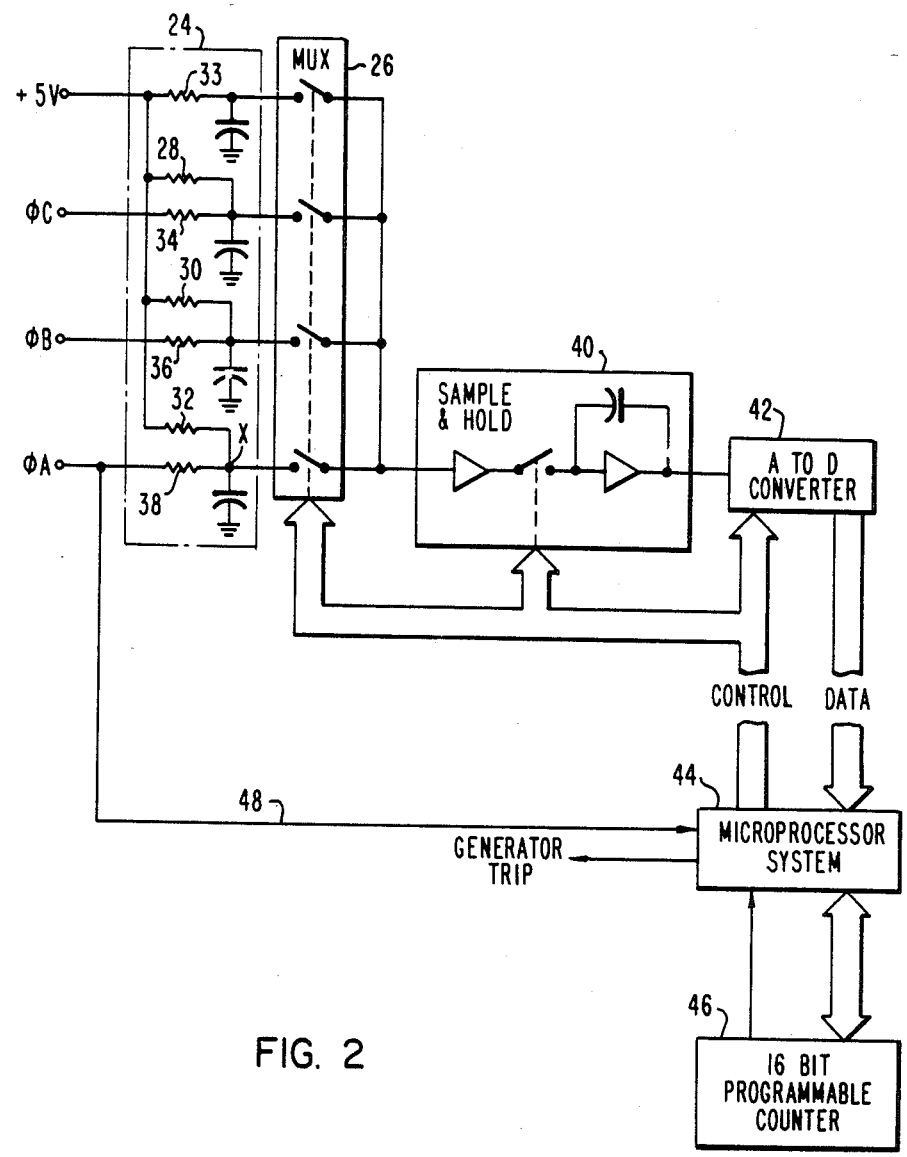
FIG. 2 is a schematic diagram of a portion of the system illustrated in FIG. 1 constructed in accordance with one embodiment of the present invention.

FIG. 2 is a schematic diagram of the generator control unit 16 in FIG. 1 which monitors the DC content of the AC waveform appearing on the three phase bus 18. Each line to neutral voltage is applied through an RC filter 24 to an input of a multiplexer 26. A 2.5 volt DC bias voltage is added to each filtered line to neutral voltage by applying a five volt signal across voltage dividers formed by resistors 28, 30 and 32 and resistors 34, 36 and 38 of the RC filter respectively. The five volt signal is also applied to a fourth input of multiplexer 26 through another section of RC filter 24. The output of multiplexer 26 is connected to a sample and hold circuit 40 which in turn is connected to an analog to digital converter 42. A microprocessor system 44, through its control outputs operates the multiplexer 26 to selectively apply the line to neutral voltages and the five volt reference voltage sequentially to the sample and hold circuit 40. The microprocessor system 44 also operates sample and hold circuit 40 to momentarily store the instantaneous value of the applied waveform at a selected instant and directs the analog to digital converter to generate a digital representation of the stored value. The analog to digital converter 42 reports its status to the microprocessor so that the digital data can be inputted to the microprocessor upon completion of the conversion process. The microprocessor then operates on the data to determine the DC content of each phase of the inverter voltage and generates a generator trip signal when prescribed limits for the DC content are exceeded.

The system of FIG. 2 is a digital filter which periodically samples each phase of the AC waveform at two points which are separated by a time interval which is substantially equal to an exact odd number of half cycles of the waveform. The sampling frequency period is determined by a 16 bit programmable timer 46. If the AC waveform is operating at a constant frequency, for example 400 hertz, the time interval between sampling points in each phase will be a constant, for example 8.75 milliseconds or 11.25 milliseconds, which corresponds to an odd multiple, 7/2 or 9/2 respectively, of the example 400 hertz output frequency. By sampling at points which are spaced an odd multiple of half cycles apart, the sampled values will always be an equal distance above and below the mid-value of the waveform. Therefore the microprocessor system can add the two successive samples and divide the result by two to determine the DC content. The system of FIG. 2 achieves unipolar operation by providing a bias voltage, equal to approximately 2.5 volts, at the output of filter 24. The bias voltage has sufficient magnitude to insure that the measured first and second instantaneous values will be of the same polarity. In this system, the DC content is determined by adding the two biased instantaneous values together and subtracting a signal equal to twice the bias voltage from the sum.

If the frequency of the AC waveform varies, the time interval between successive measurement points must be adjusted to insure that the measurement points continue to be separated by substantially an exact odd number of half cycles of the AC waveform. The system of FIG. 2 adapts to variations in the output frequency by dynamically modifying the sampling frequency of the digital filter. The frequency of the AC waveform is measured on data line 48 and used to establish a count in programmable counter 46 which is proportional to the frequency of the AC waveform. Counter 46 is set to an initial predetermined count and begins counting down, at a rate determined by a clock signal, when a gate signal derived from line 48 goes high. The counter continues to count down until the gate signal goes low. Since the gate signal remains high for a time which is proportional to the period of the phase A waveform, the final count value is proportional to the input frequency. This frequency data is then processed by the microprocessor system 44 to determine the sampling time interval which is equal to the time interval between a predetermined odd number of half cycles of the waveform. After the frequency data is read, the counter is initialized for another frequency measurement. Suitable examples of components for the circuit of FIG. 2 include an AD7501 multiplexer, an AD582 sample and hold unit, an AD571 ten bit analog to digital converter, an Intel 8085 microprocessor system, and an Intel 8253 Programmable counter.

Figure 3:
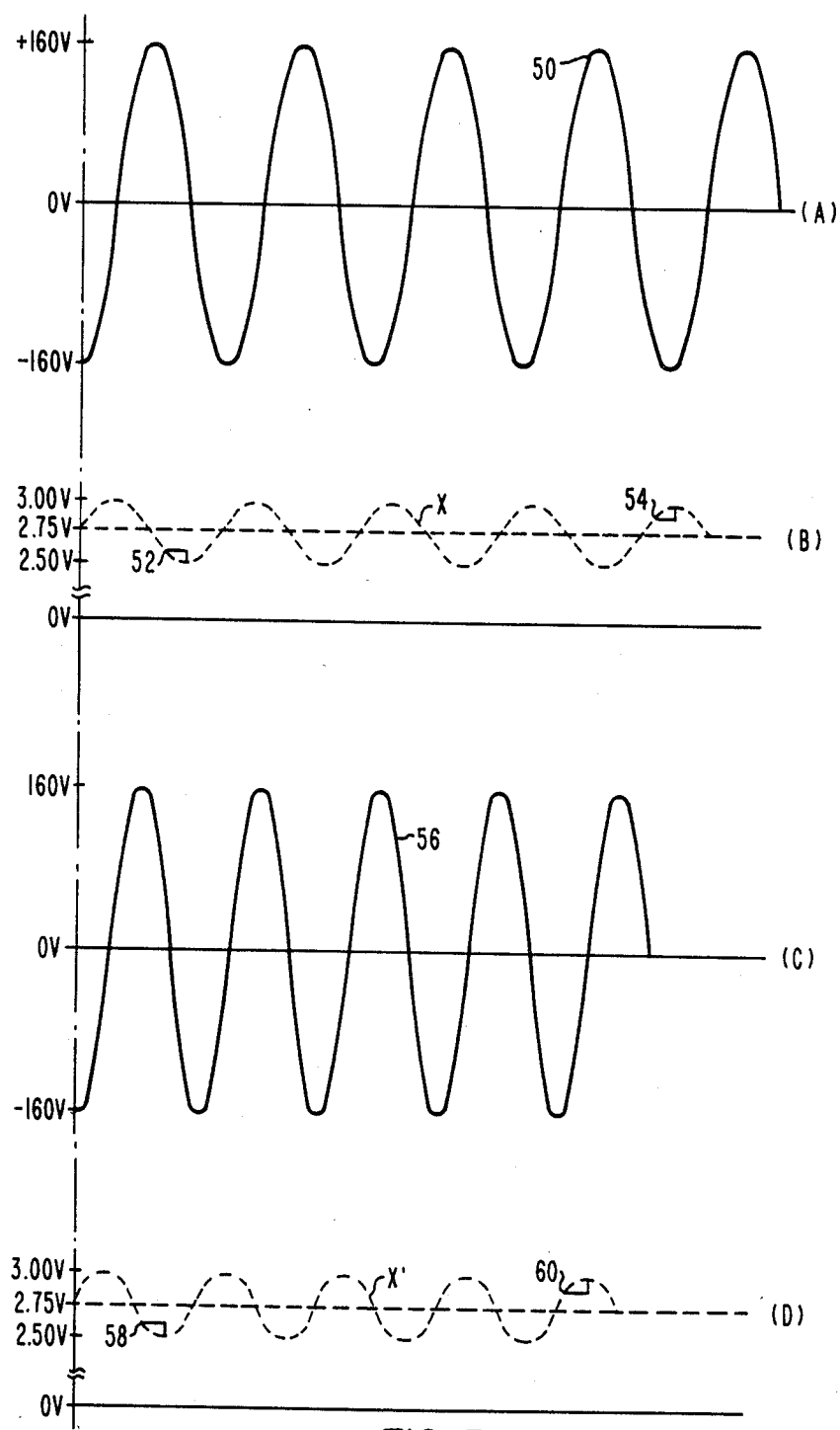
FIG. 3 is a series of waveforms which appear at selected points in the portion of the system of FIG. 2 and illustrate the tracking feature of the present invention.

The operation of the circuits of FIG. 2 is illustrated in the waveforms of FIG. 3. Waveform A of FIG. 3 represents the inverter line to neutral voltage 50, such as the phase A voltage, applied to the circuit of FIG. 2. The DC component is not apparent in this waveform due to the large 400 hertz common mode component. However, the filter 24 attenuates the 400 hertz component of the line to neutral voltages while providing unity gain for the DC components. Waveform B of FIG. 3 represents, in enlarged scale, the filtered input X to the multiplexer appearing at point X in FIG. 2 and includes the DC component of the input voltage with a 400 hertz ripple voltage superimposed and with a 2.5 volt bias added in.

The DC component is equal to the average value of the waveform X and can be determined by averaging the instantaneous values of the waveform at two discrete points 52 and 54 which are substantially an exact odd number of half cycles apart. For example, the average value of the waveform X in FIG. 2 is shown to be 0.25 volts (2.75 volts minus the 2.5 volt bias). This can be determined by adding the instantaneous value of the waveform at point 52 to the instantaneous value at point 54, dividing the sum by two and subtracting the 2.5 volt bias. The first measurement point 52 can occur at a random time in the output waveform and the second measurement point 54 must occur at substantially an exact odd number of half cycles following the first measurement point. In practice, the elapsed time between the two measuring points should be small compared to the time period over which measurable changes occur in the DC content of the output waveform. In the example shown, the second measurement is taken seven half cycles after the first.

Waveform C of FIG. 3 represents the inverter line to neutral voltage 56, such as the phase A voltage, which has a substantially different frequency than that of waveform A. The present invention adapts to variations in the output frequency by dynamically modifying the frequency of the digital filter. The concept involves the changing of the sampling rate to a value necessary to maintain substantially an exact odd multiple of half cycles of the output frequency. In waveform D of FIG. 3, the filtered output X' of waveform 56 is shown in enlarged scale. In this example, the time interval between sampling points 58 and 60 has been adjusted by the programmable counter 46 of FIG. 2 such that it remains at substantially an exact odd multiple of half cycles of the inverter output waveform 56. The instantaneous values of the waveform at points 52, 54, 58 and 60 are measured by sample and hold circuit 40. The output waveform generated by the sample and hold circuit are represented by the solid portion of waveforms X and X' since the circuit multiplexer 26 under the control of microprocessor system 44 only applies each input voltage to the sample and hold circuit during the times when measurements are to be taken.

Figure 5:
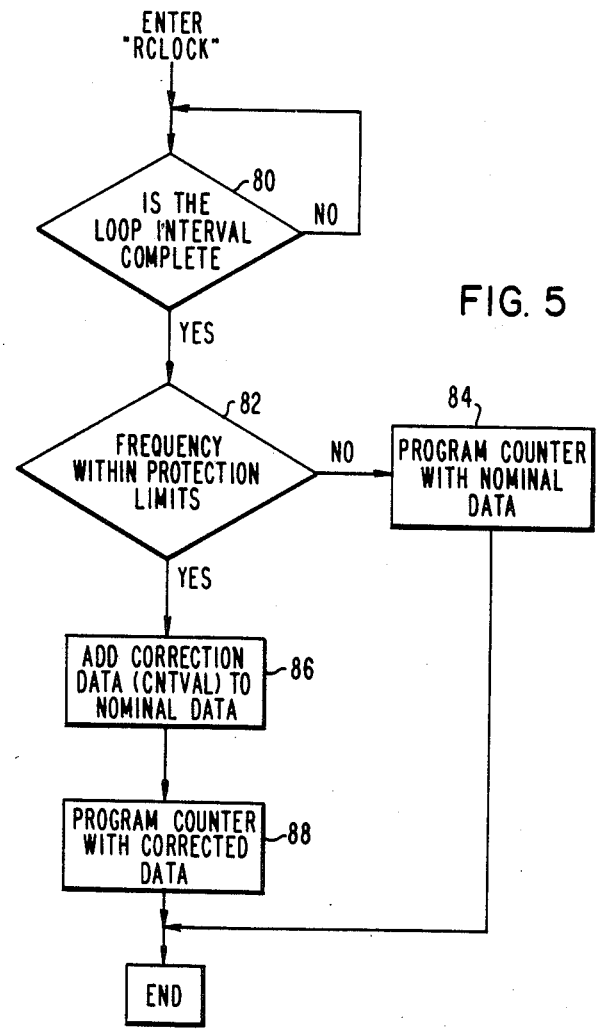
FIGS. 4 and 5 are flow charts illustrating the method of determining the time interval to be used between successive measurements taken in accordance with the present invention.
Figure 4:
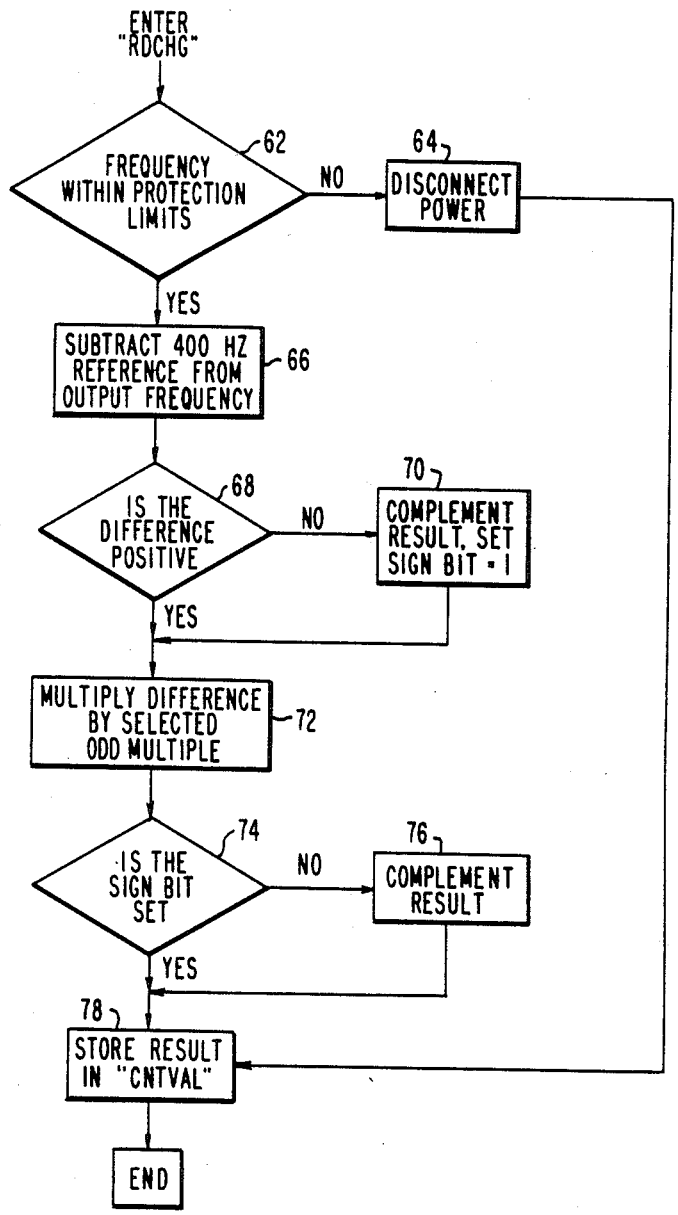

Flow charts setting forth the program under which the microprocessor system 44 and programmable counter 66 control the measurement of the storage of the two instantaneous values of each phase of the inverter output voltage are illustrated in FIGS. 4 and 5. The RDCHG routine of FIG. 4 begins by measuring the frequency of the inverter output waveform in block 62. If the frequency is beyond the range of filter tracking frequencies as defined by the minimum and maximum values of programmable counter 46, the generator control unit performs a trip function and disconnects power as in block 64. If the frequency is within acceptable limits, a constant count value in programmable counter 46 corresponding to the nominal 400 hertz is subtracted from the output frequency as shown in block 66. Block 68 checks to see if the difference is positive. If it is not, the result is complimented and a sign bit is set equal to one as shown in block 70. If the difference is positive, the difference is multiplied by a scaling factor equal to a selected odd multiple number of half cycles in block 72, such as the seven half cycles as shown in FIG. 3. Block 74 determines whether or not the sign bit has been set. If its hasn't, block 76 compliments the result. In block 78, the result is stored in CNTVAL. The value of CNTVAL will be used to modify programmable counter 46 such that the frequency of the filter is maintained at substantially an exact odd multiple of the inverter output frequency.

The RCLOCK routine of FIG. 5 begins by waiting for completion of the loop interval to start the next execution of program code as shown in block 80. When the loop interval is complete, the frequency of the inverter output waveform is again checked in block 82 to determine whether or not it is within the system protection limits. If it is not, block 84 shows that programmable counter 46 is then programmed with nominal data which in this example corresponds to a time interval equal to seven half cycles of a 400 hertz waveform. If the frequency is within protection limits, block 86 shows that the correction data CNTVAL is added to the nominal data and programmable counter 46 is programmed with the corrected data as shown in block 88. This results in the occurrence of a second sampling point at substantially in an exact odd number of half cycles following the first sampling point.

It should be apparent that the described apparatus determines the DC content in an AC waveform by: measuring the instantaneous value of the AC waveform at a first point; storing a signal representative of the first instantaneous value; measuring the frequency of the AC waveform; determining a time interval which is substantially equivalent to an exact odd number of half cycles of the AC waveform at the measured frequency; measuring the instantaneous value of the AC waveform at a second point in the waveform separated by the determined time interval from the first point; and generating a signal equal to the DC content of the AC waveform by averaging the measured first and second instantaneous values.

While a specific embodiment of the invention has been described in detail, it will be appreciated by those skilled in the art that various modifications and alternatives to the described details could be developed in light of the overall teachings of the disclosure. Accordingly, the particular arrangements disclosed are meant to be illustrative only and not limiting as to the scope of the invention which is to be given the full breadth of the appended claims and all equivalents thereof.

What is claimed is:

1. A method of determining the DC content in an AC waveform which is subject to frequency variations, said method comprising the steps of:

measuring a first instantaneous value of said AC waveform at a first point in a cycle of the AC waveform;

storing a signal representative of said first instantaneous value;

measuring the frequency of said AC waveform;

determining a time interval which is substantially equivalent to an exact odd number of half cycles of said AC waveform at the measured frequency;

measuring the instantaneous value of said AC waveform at a second point in the waveform separated by said time interval from said first point, wherein said instantaneous values of said AC waveform at said first and second points are equally and oppositely displaced from the mid-value of said AC waveform; and generating a signal equal to the DC content of said AC waveform by averaging said first and second instantaneous values of the AC waveform.

2. The method of claim 1, wherein said step of determining a time interval comprises the steps of:

subtracting the measured frequency of said AC waveform from a preselected frequency to obtain a frequency deviation;

multiplying said frequency deviation by a preselected scaling factor to obtain an incremental count;

adding said incremental count to a preselected count in a programmable counter to obtain a starting count; and causing said programmable counter to count during one half cycle of said AC waveform to achieve a final count which is proportional to a substantially exact odd number of half cycles of said AC waveform at the measured frequency.

3. The method of claim 1, wherein said first point is a random point in said AC waveform.

4. The method of claim 1, further comprising the steps of:

filtering said AC waveform prior to measuring said instantaneous values.

5. The method of claim 4, further comprising the step of:

adding a bias voltage to the filtered AC waveform prior to measuring said instantaneous values, said bias voltage being of sufficient magnitude to ensure that the first and second instantaneous values will be of the same polarity; and wherein the averaging step includes adding the two biased instantaneous values together and subtracting a signal equal to twice the bias voltage from the sum.

6. A method of determining the DC content in a plural phase AC waveform which is subject to frequency variations, said method comprising the steps of:

successively measuring a first instantaneous value of each phase of the AC waveform at a first point in each phase;

storing signals representative of said first instantaneous value of each phase of the AC waveform;

measuring the frequency of the AC waveform;

determining a time interval which is substantially equivalent to an exact odd number of half cycles of the AC waveform at the measured frequency;

successively measuring the instantaneous value of each phase of the AC waveform at respective second points in the AC waveform separated by said time interval from the respective first points, wherein said instantaneous values of each phase of the AC waveform at the first and second points are equally and oppositely displaced from the mid-value of the associated phase of the AC waveform; and generating a signal equal to the DC content of each phase by averaging the instantaneous values of the associated phase at the associated first and second points.

7. The method of claim 6, wherein said step of determining a time interval comprises the steps of:

subtracting the measured frequency of the AC waveform from a preselected frequency to obtain a frequency deviation;

multiplying said frequency deviation by a preselected scaling factor to obtain an incremental count;

adding said incremental count to a preselected count in a programmable counter to obtain a starting count; and causing said programmable counter to count during one half cycle of said AC waveform to achieve a final count which is proportional to a substantially exact odd number of half cycles of said AC waveform at the measured frequency.

8. The method of claim 6, wherein said first points are random points in each phase of said AC waveform.

9. The method of claim 6, further comprising the step of:

filtering said AC waveform prior to measuring said instantaneous values.

10. The method of claim 9, further comprising the step of:

adding a bias voltage to the filtered AC waveform prior to measuring said instantaneous values, said bias voltage being of sufficient magnitude to ensure that all instantaneous values are of the same polarity; and wherein the averaging step includes adding the two biased instantaneous values for each phase together and subtracting a signal equal to twice the bias voltage from the sum.

11. An apparatus for generating a signal representative of the DC content of an AC waveform which is subject to frequency variations, said apparatus comprising:

means for measuring the instantaneous value of the AC waveform;

means for storing said instantaneous value;

means for determining a time interval which is substantially equal to an exact odd number of half cycles of the AC waveform; and control means for operating the measuring means and storing means to measure the instantaneous value of the AC waveform at said first point in time and to store the measured value, and for subsequently operating the measuring means to measure the instantaneous value of the AC waveform at a second point in time spaced from the first point by said time interval, wherein said instantaneous values of the AC waveform at said first and second points are equally and oppositely displaced from the midvalue of the AC waveform, and for generating a DC content signal by averaging the first and second measured instantaneous values.

12. An apparatus as recited in claim 11, wherein said AC waveform is multiphased and wherein said control means includes:

means for operating the measuring means to successively measure the instantaneous value of each phase of the AC waveform at a first point in a cycle of each phase and to store the instantaneous value in said storage means, for subsequently operating said measuring means to measure the instantaneous value of each phase of the AC waveform at a second point in time spaced from said first point by said time interval, wherein said instantaneous values of each phase of said AC waveform at said first and second points are equally and oppositely displaced from the midvalue of the associated phase of said AC waveform, and to store the measured instantaneous values in said storage means and for generating DC content signals for each phase by averaging the stored instantaneous values at said first and second points in each phase.

13. An apparatus as recited in claim 12, wherein said measuring means includes:
   a multiplexer;
   a sample and hold circuit; and
   wherein said control means includes means for operating said multiplexer to successively apply each phase of the AC waveform to the sample and hold circuit.

14. An apparatus for generating a signal representative of th DC content of an AC waveform which is subject to frequency variations, said apparatus comprising:
   a sample and hold circuit;
   an analog to digital converter;
   a programmable counter being connected to begin counting at a predetermined initial count; and
   a digital processor for operating the sample and hold circuit to hold the instantaneous value of the AC waveform at a first point in time, for operating the analog to digital converter to convert the instantaneous value of the AC waveform into a digital signal, for storing the digital signal, for operating the sample and hold circuit to hold the instantaneous value of the AC waveform at a second point in time spaced from said first point by a time interval corresponding to a final count in said programmable counter, said time interval being substantially equal to an exact odd number of half cycles of said AC waveform, wherein said instantaneous values of said AC waveform at said first and second points are equally and oppositely displaced from the mid-value of said AC waveform, for operating said analog to digital converter to convert the second instantaneous value into a second digital signal and for averaging said first and second digital signals to generate a signal representative of the DC content of said AC waveform.

15. An apparatus as recited in claim 14, further including:
   a multiplexer;
   wherein said AC waveform is a multiphase waveform and said digital processor operates said multiplexer to successively apply the instantaneous value of each phase of the multiphase AC waveform at respective first points in a cycle of each phase to said sample and hold circuit for conversion by the analog to digital converter and for storage by the digital processor, operates the multiplexer to successively apply the instantaneous value of each phase of the multiphase AC waveform at a second point spaced from the respective first point by said time interval to the sample and hold circuit for conversion by the analog to digital converter and for storage by the digital processor, wherein said instantaneous values of each phase of said AC waveform of said first and second points are equally and oppositely displaced from the mid-value of the associated phase of said AC waveform, and generates signals representative of the DC content of said AC waveform by averaging said first and second instantaneous values of each phase.

16. An apparatus as recited in claim 15, further comprising:
   means for biasing said AC waveform by a DC voltage prior to measuring said instantaneous values, said bias voltage being of sufficient magnitude to ensure that the first and second instantaneous values will be of the same polarity; and
   wherein said digital processor averages the two biased instantaneous values by adding them together and subtracting a signal, equal to twice the bias voltage, from the sum.

* * * * *